(12) United States Patent
Hartung et al.

(10) Patent No.: US 9,129,934 B2
(45) Date of Patent: Sep. 8, 2015

(54) POWER SEMICONDUCTOR MODULE AND METHOD FOR OPERATING A POWER SEMICONDUCTOR MODULE

(75) Inventors: Hans Hartung, Warstein (DE); Dirk Siepe, Warstein (DE)

(73) Assignee: Infineon Technologies AG, Neubiberg (DE)

(*) Notice: Subject to any disclaimer, the term of this patent is extended or adjusted under 35 U.S.C. 154(b) by 404 days.

(21) Appl. No.: 12/949,017

(22) Filed: Nov. 18, 2010

(65) Prior Publication Data

US 2011/0115068 A1 May 19, 2011

(30) Foreign Application Priority Data

Nov. 19, 2009 (DE) .......................... 10 2009 046 858

(51) Int. Cl.
*H01L 23/48* (2006.01)
*H01L 23/52* (2006.01)
(Continued)

(52) U.S. Cl.
CPC .............. *H01L 24/40* (2013.01); *H01L 24/32* (2013.01); *H01L 24/48* (2013.01); *H01L 24/49* (2013.01); *H01L 24/83* (2013.01); *H01L 25/072* (2013.01); *H01L 23/24* (2013.01); *H01L 24/29* (2013.01); *H01L 2224/04026* (2013.01); *H01L 2224/2908* (2013.01); *H01L 2224/2919* (2013.01); *H01L 2224/29339* (2013.01); *H01L 2224/32225* (2013.01); *H01L 2224/45147* (2013.01); *H01L 2224/4846* (2013.01); *H01L 2224/48091* (2013.01); *H01L 2224/48227* (2013.01); *H01L 2224/48472* (2013.01);
(Continued)

(58) Field of Classification Search
None
See application file for complete search history.

(56) References Cited

U.S. PATENT DOCUMENTS 6,545,364 B2    3/2002    Sakamoto et al.
6,774,465 B2*    8/2004    Lee et al. ...................... 257/671
(Continued)

FOREIGN PATENT DOCUMENTS

DE    10064691 A1    7/2002
DE    10357796 A1    7/2005
(Continued)

OTHER PUBLICATIONS

SKF USA in "Lubricants", 2008, Publication 750-900, retrieved from <http://www.skf.com/files/773820.pdf> on Oct. 19, 2012.*
(Continued)

*Primary Examiner* — Michael Jung
(74) *Attorney, Agent, or Firm* — Murphy, Bilak & Homiller, PLLC

(57) ABSTRACT

A power semiconductor module includes a circuit carrier including an insulation carrier having a top side on which a metallization layer is arranged. A power semiconductor chip is arranged on a side of the metallization layer facing away from the insulation carrier, and which has on a top side of the power semiconductor chip facing away from the circuit carrier an upper chip metallization composed of copper or a copper alloy having a thickness of greater than or equal to 1 μm. An electrical connection conductor composed of copper or a copper alloy is connected to the upper chip metallization at a connecting location. A potting compound extends from the circuit carrier to at least over the top side of the power semiconductor chip and completely covers the top side of the power semiconductor chip, encloses the connection conductor at least in the region of the connecting location, and has a penetration of less than or equal to 30 according to DIN ISO 2137 at a temperature of 25° C.

11 Claims, 4 Drawing Sheets

(51) Int. Cl.
  H01L 23/00 (2006.01)
  H01L 25/07 (2006.01)
  *H01L 21/00* (2006.01)
  *H01L 23/24* (2006.01)

(52) U.S. Cl.
  CPC ............. *H01L 2224/49111* (2013.01); *H01L 2224/73265* (2013.01); *H01L 2224/8382* (2013.01); *H01L 2224/8384* (2013.01); *H01L 2924/01004* (2013.01); *H01L 2924/014* (2013.01); *H01L 2924/01005* (2013.01); *H01L 2924/01006* (2013.01); *H01L 2924/01013* (2013.01); *H01L 2924/01014* (2013.01); *H01L 2924/01015* (2013.01); *H01L 2924/01023* (2013.01); *H01L 2924/01029* (2013.01); *H01L 2924/0132* (2013.01); *H01L 2924/01033* (2013.01); *H01L 2924/01047* (2013.01); *H01L 2924/01068* (2013.01); *H01L 2924/01079* (2013.01); *H01L 2924/01082* (2013.01); *H01L 2924/0665* (2013.01); *H01L 2924/0781* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01)

(56) References Cited

U.S. PATENT DOCUMENTS

| | | | | |
|---|---|---|---|---|
| 2007/0246838 | A1* | 10/2007 | Hoeglauer et al. | 257/781 |
| 2008/0093729 | A1* | 4/2008 | Siepe et al. | 257/703 |
| 2009/0243089 | A1* | 10/2009 | Hohlfeld et al. | 257/734 |
| 2010/0127371 | A1* | 5/2010 | Tschirbs | 257/684 |

FOREIGN PATENT DOCUMENTS

| | | | |
|---|---|---|---|
| DE | 102004021927 | A1 | 12/2005 |
| DE | 102005016650 | A1 | 11/2006 |
| DE | 102005030247 | A1 | 1/2007 |
| DE | 102006046851 | A1 | 4/2008 |

OTHER PUBLICATIONS

BP Marine, Energrease HTG 2 High Temperature Bearing Grease: Technical Data Sheet, Oct. 13, 2009, pp. 1-2. Retrieved online at <http://www.bp.com/sectiongenericarticle.do?categoryId=9035858&contentId=7066489> on Feb. 24, 2013.*

Wacker, Product Catalog for SEMICOSIL UV, Sep. 2010, pp. 1-12 (retrieved from internet at http://www.wacker.com/cms/media/publications/downloads/6722_en.pdf).*

U.S. Appl. No. 12/914,171, filed Oct. 28, 2010, first-named inventor: Schloerke, title: Semiconductor Module Having an Insert and Method for Producing a Semiconductor Module Having an Insert.

Office Action issued Sep. 20, 2010 in re: Application No. DE10 2009 046 858.7-33.

Author Unknown. "Wacker SilGel 612." Wacker Silicones, 2004. pp. 1-3.

Author Unknown. "Siliconprodukte für die Elektronikindustrie." Wacker Silicones, 2002. pp. 1-16.

Author Unknown. "RTV Siliconkautschuke —kleben, abdichten, vergiessen and beschichten." Wacker Silicones, 2002. pp. 1-20.

Author Unknown. "RTV Siliconkautschuke vergleichen." Wacker Silicones, 2002. pp. 1-13.

Author Unknown. "Penetration." Koehler Instrument Company, Inc. May 24, 2006. pp. 23-30.

Author Unknown. "Die Härteprüfung." Karg Industrietechnik, 2004. pp. 1-4. Also available online at http://www.karg-industrietechnik.de/produkte/mechanische-pruefgeraete/Haertepruefgeraete.php.

* cited by examiner

US 9,129,934 B2

POWER SEMICONDUCTOR MODULE AND METHOD FOR OPERATING A POWER SEMICONDUCTOR MODULE

PRIORITY CLAIM

This application claims priority from German Patent Application No. 10 2009 046 858.7 filed on 19 Nov. 2009, said German Patent Application incorporated herein by reference in its entirety.

BACKGROUND

Power semiconductor chips incorporated in power semiconductor modules are often operated at very high temperatures. The permissible junction temperatures continue to increase in the course of the further development of the power semiconductor chips. This gives rise to the problem that a very soft potting compound, e.g. a silicone gel, filled into the power semiconductor module becomes detached from other components of the module, such as e.g. power semiconductor chips, connection conductors, etc., which are embedded into the potting compound, over the course of time with formation of cavities or cracks. The insulation strength of the module can be impaired as a result.

SUMMARY

A power semiconductor module is described herein which includes a potting compound and a power semiconductor chip, wherein, even at high operating and/or storage temperatures, the formation of cavities and cracks is prevented or at least improved by comparison with conventional power semiconductor modules. A method for operating the power semiconductor module at high temperatures is also described herein.

According to an embodiment of a power semiconductor module, the module includes a circuit carrier including an insulation carrier having a top side on which a metallization layer is arranged. A power semiconductor chip is arranged on a side of the metallization layer facing away from the insulation carrier, and which has on a top side of the power semiconductor chip facing away from the circuit carrier an upper chip metallization composed of copper or a copper alloy having a thickness of greater than or equal to 1 μm. An electrical connection conductor composed of copper or a copper alloy is connected to the upper chip metallization at a connecting location. A potting compound extends from the circuit carrier to at least over the top side of the power semiconductor chip and completely covers the top side of the power semiconductor chip, encloses the connection conductor at least in the region of the connecting location, and has a penetration of less than or equal to 30 according to DIN ISO 2137 at a temperature of 25° C.

According to an embodiment of a method for operating the power semiconductor module, the method includes operating the power semiconductor chip for a duration of at least 20 seconds at a junction temperature of not less than 150° C.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis is placed upon illustrating the principles of the invention. Moreover, in the figures, like reference numerals designate corresponding parts. In the drawings.

DETAILED DESCRIPTION

The following detailed description refers to the accompanying drawings, which form part of the description and which elucidate, on the basis of concrete configurations, the manner in which embodiments can be realized. Direction indications in this regard such as e.g. "at the top", "at the bottom", "at the front", "at the rear", "front", "rear", etc. are used with respect to the orientation of the figures explained. Since the elements in the configurations can be arranged in a multiplicity of different orientations, the direction-based terminology serves merely for clear explanation and should in no way be understood as restrictive. It is pointed out that the embodiments described herein can also encompass other configurations. Furthermore, it is pointed out that the features of the various exemplary configurations described below can be combined with one another, unless expressly mentioned otherwise, or unless the combination of specific features is impossible for technical reasons.

Figure 1:
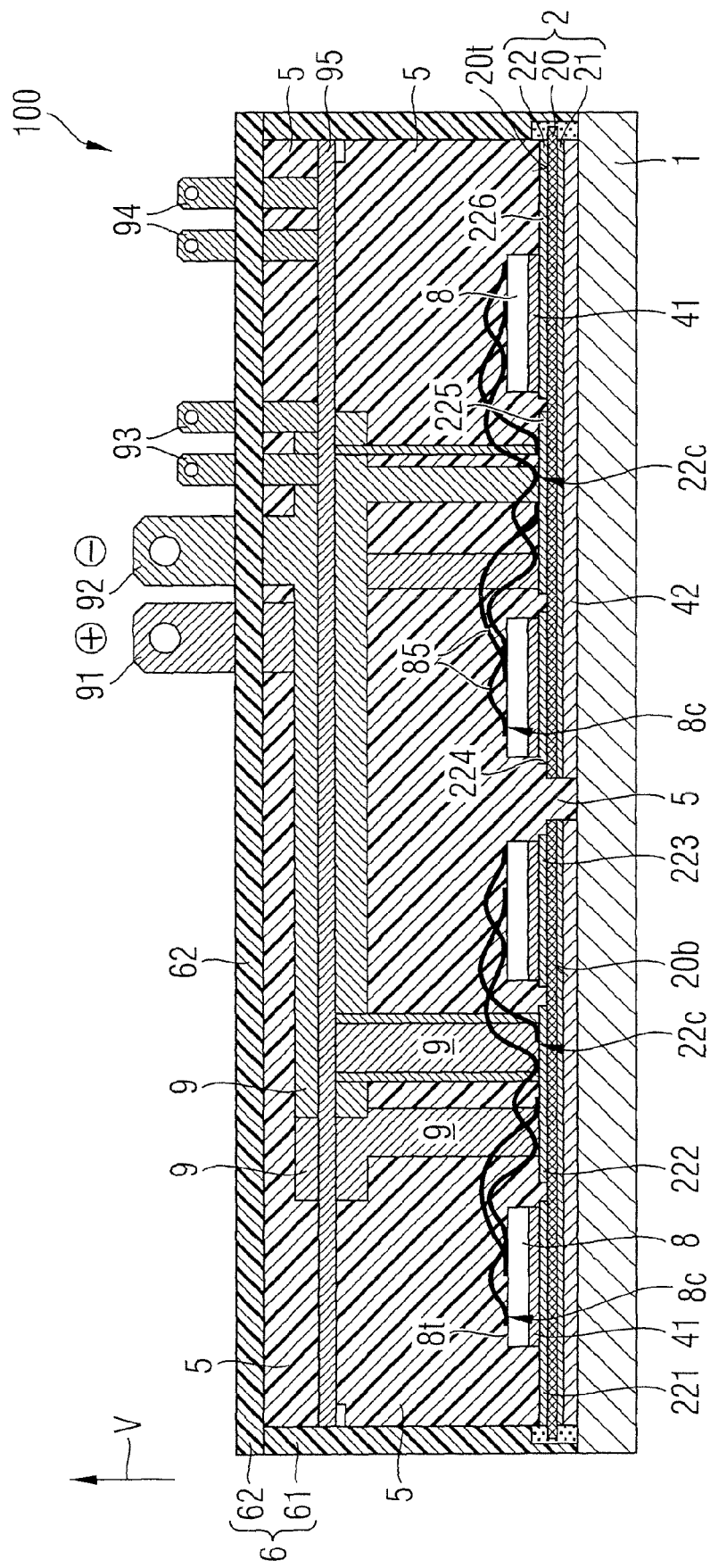
FIG. 1 shows a vertical section through a power semiconductor module potted with a potting compound.

FIG. 1 shows a vertical section through a power semiconductor module 100. The power semiconductor module 100 has one or more power semiconductor chips 8, which can be embodied for example as MOSFETs (metal oxide field-effect transistors), IGBTs (insulated gate bipolar transistors), JFETs (junction field-effect transistors), diodes, thyristors or any other power semiconductor components.

The power semiconductor chips 8 of the power semiconductor module 100 are arranged on one or more substrates 2, which are or is in turn fixedly connected to an optional, common baseplate 1 of the power semiconductor module 100 by a connecting layer 42. The power semiconductor chips 8 are semiconductor chips having high rated currents and/or high rated voltages. For example, the rated currents can be greater than 50 A or greater than 75 A, and the rated voltages can be greater than 400 V, for example. Moreover, the power semiconductor chips can have base areas of, for example, more than 5.5 mm×5.5 mm or more than 7 mm×7 mm. In order to make electrical contact with the power semiconductor chips 8, the power semiconductor chips 8 have an upper chip metallization on their top side facing away from the corresponding substrate 2, and also a lower chip metallization on their underside facing the corresponding substrate 2. However, the upper and lower chip metallizations are not illustrated in detail in FIG. 1.

Each of the substrates 2 comprises an insulation carrier 20, which is embodied as a flat laminar and is provided with an upper metallization 22 on its upper main surface, which is designated hereinafter as top side 20t, and with an optional lower metallization 21 on its lower main surface, which is designated hereinafter as underside 20b. The upper metallization 22 is structured and thereby has conductor tracks 221, 222, 223, 224, 225, 226 spaced apart from one another.

The conductor tracks of the upper metallization 21 can be arbitrarily shaped as required. Thus, at least some conductor tracks can be embodied in a planar fashion or have a planar portion, such that a planar portion of the upper metallization 22 is present, on which one or more of the power semiconductor chips 8 can be fixed by a connecting layer 41 with formation of an electrically conductive connection between the planar portion and an underside metallization of the relevant power semiconductor chip or chips 8.

By way of example, soldering, diffusion soldering, electrically conductive adhesive bonding are suitable as connecting techniques for producing the connecting layers 42 and/or 41. Low-temperature pressure sintering (LTJT) is likewise suitable. For different connecting layers 41, and/or for different connecting layers 42, 41, it is possible to use any desired connecting techniques in any desired combinations with one another.

In the case of low-temperature pressure sintering, a paste comprising silver and a solvent is introduced between the joining partners to be connected, that is to say e.g. between a power semiconductor chip 8 and the upper metallization 22 in order to produce a connecting layer 41, or between the lower metallization 21 and the baseplate 1 in order to produce the connecting layer 42. In order to obtain a particularly high strength of the connection, it is advantageous if the parts to be connected to one another have, at their surfaces to be connected to one another, in each case a coating composed of a noble metal or a noble metal alloy, e.g. composed of silver, gold or a gold-silver alloy.

The joining partners and the paste situated between them are then pressed onto one another with a high pressure and in a predefined temperature range in an oxygen-containing atmosphere, thereby giving rise to a fixed and permanent connection between the joining partners.

Insofar as connecting layers 42 and/or 41 are embodied as soldering connections, the connecting regions of the upper metallization 22, of the lower metallization 21 and also of the baseplate 1 can have a surface coating that improves the solderability. By way of example, silver, NiAu, NiPd or NiPdAu are suitable as materials for such surface coatings.

The metallizations 21 and 22 are fixedly connected to the underside 20b and, respectively, to the top side 20t of the insulation carrier 20. The insulation carrier 20 can be a ceramic, for example. Examples of suitable ceramic materials therefor include aluminum nitride (AlN), aluminum oxide (Al2O3), silicon nitride (Si3N4), silicon carbide (SiC), or beryllium oxide (BeO). The metallizations 21 and 22 are composed of copper or a copper alloy comprising more than 90% by weight or to the extent of more than 99% by weight of copper. However, the metallizations 21 and/or 22 can likewise also be formed from CuFe2P or CuSn6. The substrate 2 can be, for example, a DCB substrate (DCB=Direct Copper Bonding), a DAB substrate (DAB=Direct Aluminum Bonding) or an AMB substrate (AMB=Active Metal Brazing).

The electrical interconnection of the power semiconductor chip or chips 8 is effected, on the one hand, by the conductor tracks formed in the upper metallization 22 of the substrate 2. On the other hand, electrical connection conductors can be provided, which can be embodied e.g. as bonding wire 85 or as metallic busbar arrangement 9 comprising one or more busbars, as flat ribbon (which e.g. can be bonded in a similar manner to a bonding wire and can be unwound from a roll, bonded and cut off during the bonding process), or as prefabricated connecting plate having an approximately rectangular conductor cross section ("clip"). A connection conductor (here merely by way of example the bonding wire 85) can, for example, be bonded or soldered onto an upper metallization of a power semiconductor chip 8 at a connecting location 8c and/or onto an upper metallization 22 of a substrate 2 at a connecting location 22c. A busbar of the busbar arrangement 9 can e.g. be connected to an upper metallization of a power semiconductor chip 8 or an upper metallization 22 of a substrate 2 by soldering, diffusion soldering, low-temperature pressure sintering or ultrasonic bonding. In addition, connections between a busbar and an upper metallization 22 of a substrate 2 can also be produced by welding.

The power semiconductor module 100 furthermore includes a housing 6 having a circumferential, electrically insulating housing frame 61 closed in a ring-shape fashion, and also an optional housing cover 62. The housing 6 can, for example, be composed of plastic and be produced by injection-molding. The housing 6 and the baseplate 1, which is composed of a thermally highly conductive material, for example composed of copper or aluminum, or composed of an alloy comprising at least one of these metals, give rise to a substantially closed interior in which the power semiconductor chips 8 and the substrate or substrates 2 are arranged.

In order to connect the power semiconductor module 100 externally for example to a power supply, a load, a control unit, etc., connections 91, 92, 93, 94 are provided. The connections 91, 92 can, for example, be embodied as power supply connections and be electrically and/or mechanically connected to portions 221, 222, 223, 224, 225, 226 of the upper metallization 22. Power supply connections can also be positioned in the frame of the housing and be connected to the upper substrate metallization 22 by bonding wires. The connections 93, 94 can be, for example, control connections for one or more of the power semiconductor chips 8, or output connections at which signals can be output which provide information concerning the status of the module 100.

An optional printed circuit board (PCB) 95 for interconnecting internal driver connections is provided above the power semiconductor chips 8. The printed circuit board 95 can also be equipped with control electronics for driving the controllable ones of the power semiconductor chips 8. Power semiconductor modules containing control electronics are also referred to as intelligent power modules (IPM).

In order to increase the insulation strength, the power semiconductor module 100 is potted with a potting compound 5. The potting compound 5 can extend in a vertical direction v from the circuit carrier 2 to at least over that side of the power semiconductor chips 8 which faces away from the circuit carrier 2, and can completely cover this side of the power semiconductor chips 8. In addition, the potting compound 5 can completely or at least partly enclose at least the connection conductors 85 which are bonded onto those sides of the power semiconductor chips 8 which face away from the circuit carriers 2, in such a way that the connection conductors 85 are not exposed anywhere. In addition, the potting compound 5 can optionally extend beyond the circuit board 95 and even over the components mounted, if appropriate, on the circuit board 95, such that the circuit board 95 and, if appropriate, the components are also completely covered by the potting compound 5 and embedded into the potting compound 5. As a result, the components incorporated in the power semiconductor module are both electrically insulated and mechanically stabilized. Laterally alongside a circuit carrier 2, the potting compound 5 can additionally extend as far as the baseplate 1, as is the case between the two substrates 2 in the example shown.

The potting compound 5 has a penetration of less than or equal to 30 and optionally of greater than or equal to 10 according to DIN ISO 2137 at a temperature of 25° C. It is thus significantly harder than the conventional soft potting compounds which are used for the potting of power semiconductor modules, the penetration of which is approximately in the range of 50 to 70. However, this gives rise to the problem that during the operation of the power semiconductor module 100, on account of the high temperatures and thermal cycling loads, severe shear forces and tensile forces occur between the potting compound 5 and the connection conductors 9, 85. On account of these forces, the use of such a hard potting compound 5 is prohibited in conventional power semiconductor modules since the connection conductors used in conventional power semiconductor modules or their connections to a top side of a power semiconductor chip and/or to an upper substrate metallization do not have sufficient long-term stability.

Therefore, in the case of power semiconductor modules in accordance with the embodiments described herein, provision is made for using connection conductors 9, 85 which are composed of one of the following materials: pure copper, at least 90% by weight copper, at least 99% by weight copper, or at least 99.9% by weight copper. Materials with such a high proportion of copper have a significantly higher mechanical stability than the connection conductors in the case of conventional power semiconductor modules, which are typically composed of aluminum or aluminum-based alloys. By virtue of the use of any of these copper-based materials, at least in the case of those connection conductors 9, 85 which are arranged or connected at mechanically particularly sensitive locations of the power semiconductor module—despite the use of a hard potting compound 5 making contact with or enclosing said connection conductors 9, 85—it is possible to achieve a sufficient mechanical long-term stability of the connection conductors 9, 85 themselves and/or of the connecting locations thereof for example to a chip top side 8t or an upper substrate metallization 22.

By way of example, all connection conductors 9, 85 of the power semiconductor module 100 which are connected to a chip top side 8t at connecting locations 8c and which are covered by the potting compound 5 at least at said connecting locations 8c can be composed of one of the following materials: pure copper, at least 90% by weight copper, at least 99% by weight copper, or at least 99.9% by weight copper. Since the highest temperatures of the power semiconductor module 100 occur in the region of the power semiconductor chips 8, significant improvements over conventional modules can be achieved by using of any of these copper-based materials, at least in the case of those connection conductors 9, 85.

In some embodiments, the entire power semiconductor module 100 has no connection conductors 9, 85 which are wholly or at least partly covered by the potting compound 5 and which are composed of a different material than one of the following materials: pure copper, at least 90% by weight copper, at least 99% by weight copper, or at least 99.9% by weight copper. These improvements have an advantageous effect especially when the power semiconductor chips 8 are used in alternating switching operation, as is the case of converters, for example. In alternating switching operation, the power semiconductor chips 8 are alternately successively switched on and off at high frequency, such that great and rapidly changing temperature fluctuations occur, which further increases the thermal cycling loads acting on the connecting locations 8c at the chip top sides, and also the thermal cycling loads acting on the connecting locations 22t at the upper substrate metallization 22.

It may not be desirable for the potting compound 5 to be established as very hard, since severe thermomechanical stresses can then again occur between the potting compound 5 and, in particular, the connection conductors 9, 85. It can therefore be advantageous if the potting compound 5 has a penetration of greater than or equal to 10 according to DIN ISO 2137 at a temperature of 25° C.

The potting compound 5 can be, for example, a silicone gel, or a silicone resin or an epoxy resin. It can be embodied as one-, two- or multi-component potting material. By way of example, the potting compound 5 can be embodied as two-component phenyl silicone gel with internal adhesion promoter. The penetration of the potting can be set e.g. by variation of the mixing ratio of the two components from relatively hard to resin.

The operation of such a power semiconductor module 100 can be effected such that at least one of the power semiconductor chips 8 is operated for a duration of at least 20 seconds at a junction temperature of not less than 150° C. or for a duration of at least 10 seconds at a junction temperature of not less than 160° C. Particularly if a power semiconductor chip 8 is operated for a duration of at least 10 s at a junction temperature of not less than 175° C., it can be advantageous if a bonding wire 85 bonded to the power semiconductor chip 8 is composed of pure copper or composed of copper to the extent of at least 99.9% by weight.

Figure 2:
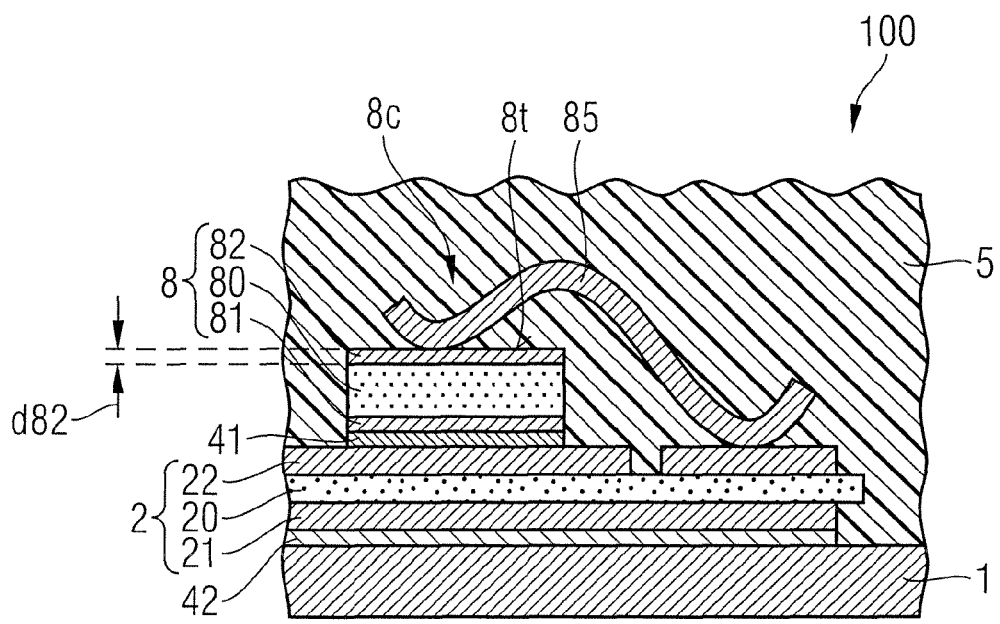
FIG. 2 shows a vertical section through a portion of a power semiconductor module potted with a potting compound, wherein a power semiconductor chip is electrically connected on the top side by a bonding wire.
Figure 3:
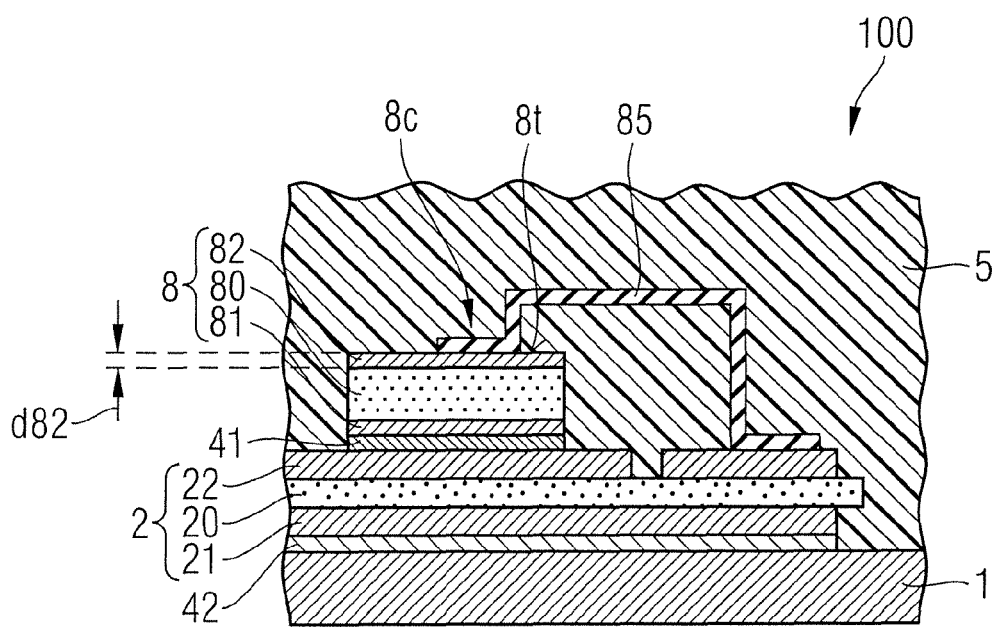
FIG. 3 shows a vertical section through a portion of a power semiconductor module potted with a potting compound, wherein a power semiconductor chip is electrically connected on the top side by a clip.
Figure 4:
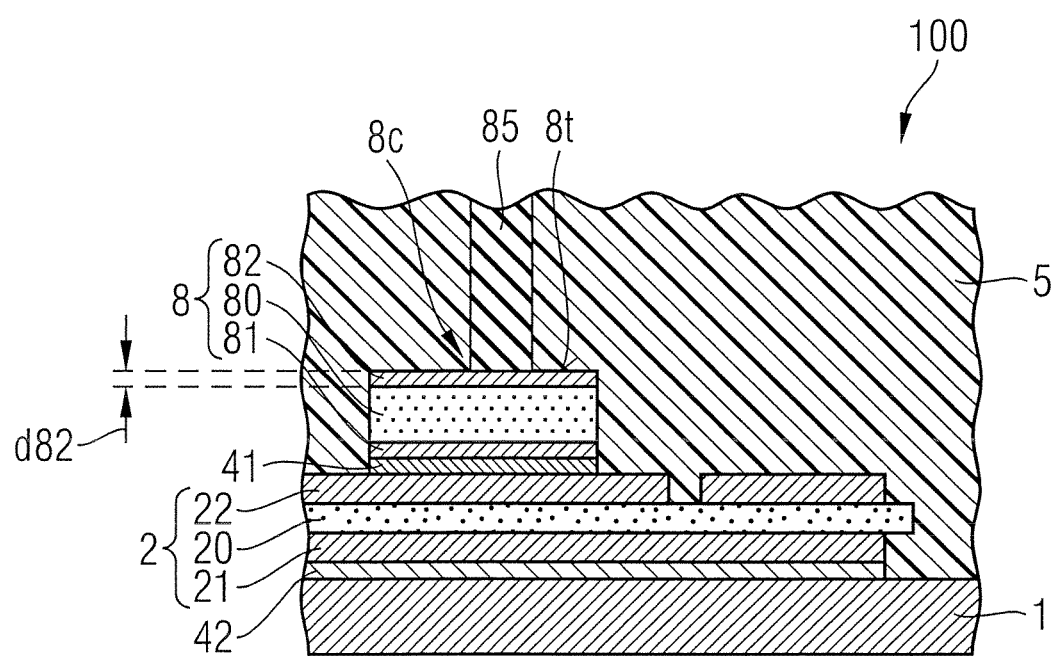
FIG. 4 shows a vertical section through a portion of a power semiconductor module potted with a potting compound, wherein a power semiconductor chip is electrically connected on the top side by a connection lug.

FIGS. 2 to 4 in each case show a vertical section through a portion of a power semiconductor module 100 potted with a potting compound 5. The module 100 has at least one power semiconductor chip 8, which is embodied as a vertical power semiconductor chip, and which includes a semiconductor body 80, a lower chip metallization 81 which is arranged at that side of the power semiconductor chip 8 facing the substrate 2, and an upper chip metallization 82 which is arranged at that side of the power semiconductor chip 8 facing away from the substrate 2. In addition to the chip metallizations 81, 82 shown, between the semiconductor body 20 and the relevant chip metallization 81, 82, one or more optional metallization layers can also be provided, e.g. as diffusion barriers. Likewise, on those sides of the chip metallizations 81, 82 shown which face away from the semiconductor body 80, one or more further optional metallization layers can also be provided, for example in order to improve the solderability or in order to prevent oxidation of the relevant chip metallization 81, 82.

In order to electrically connect the power semiconductor chip 8 on the top side, the upper chip metallization 82 is electrically conductively connected to a connection conductor 85 at a connecting location 8c. Examples of suitable connecting techniques for this purpose include ultrasonic bonding, soldering, low-temperature pressure sintering or electrically conductive adhesive bonding. The connection conductor 85 and the upper chip metallization 82 are embedded into the potting compound 5 at least in the region of the connecting location 8c.

Since the potting compound 5 has a penetration of 10 to 30 according to DIN ISO 2137 at a temperature of 25° C., the connection between the connection conductor 85 and the upper chip metallization 82 has a sufficient mechanical stability. In order to achieve this stability, it is provided that the upper chip metallization 82 is composed of copper or at least comprises copper and that has a thickness of at least 1 μm. The upper chip metallization 82 can, for example, also be predominantly composed of copper, that is to say to the extent of more than 50% by weight. In addition, the connection conductor 85 is composed of one of the following materials: pure copper, at least 90% by weight copper, at least 99% by weight copper, or at least 99.9% by weight copper.

The connection conductor 85 is embodied as a bonding wire in FIG. 2, as a clip or ribbon in FIG. 3, and as an external connection lug or as part of an internal busbar arrangement of the module 100 in FIG. 4. Instead of only one connection conductor, it is also possible for two or more connection conductors to be electrically conductively connected in any desired combinations with one another at further connecting locations 8c of the upper chip metallization 82 which are situated on the upper chip metallization 82, e.g. in order to achieve the current-carrying capacity required for the power semiconductor chip 8.

Independently of whether the upper chip metallization 82 is connected with only one or a plurality of connection conductors 85, it can be provided, for example, that the sum of the conductor cross sections of all connection conductors 85 which are connected to the upper chip metallization 82 at a respective connecting location 8c situated above the upper chip metallization 82 is at least 0.75 mm$^2$.

Figure 5:
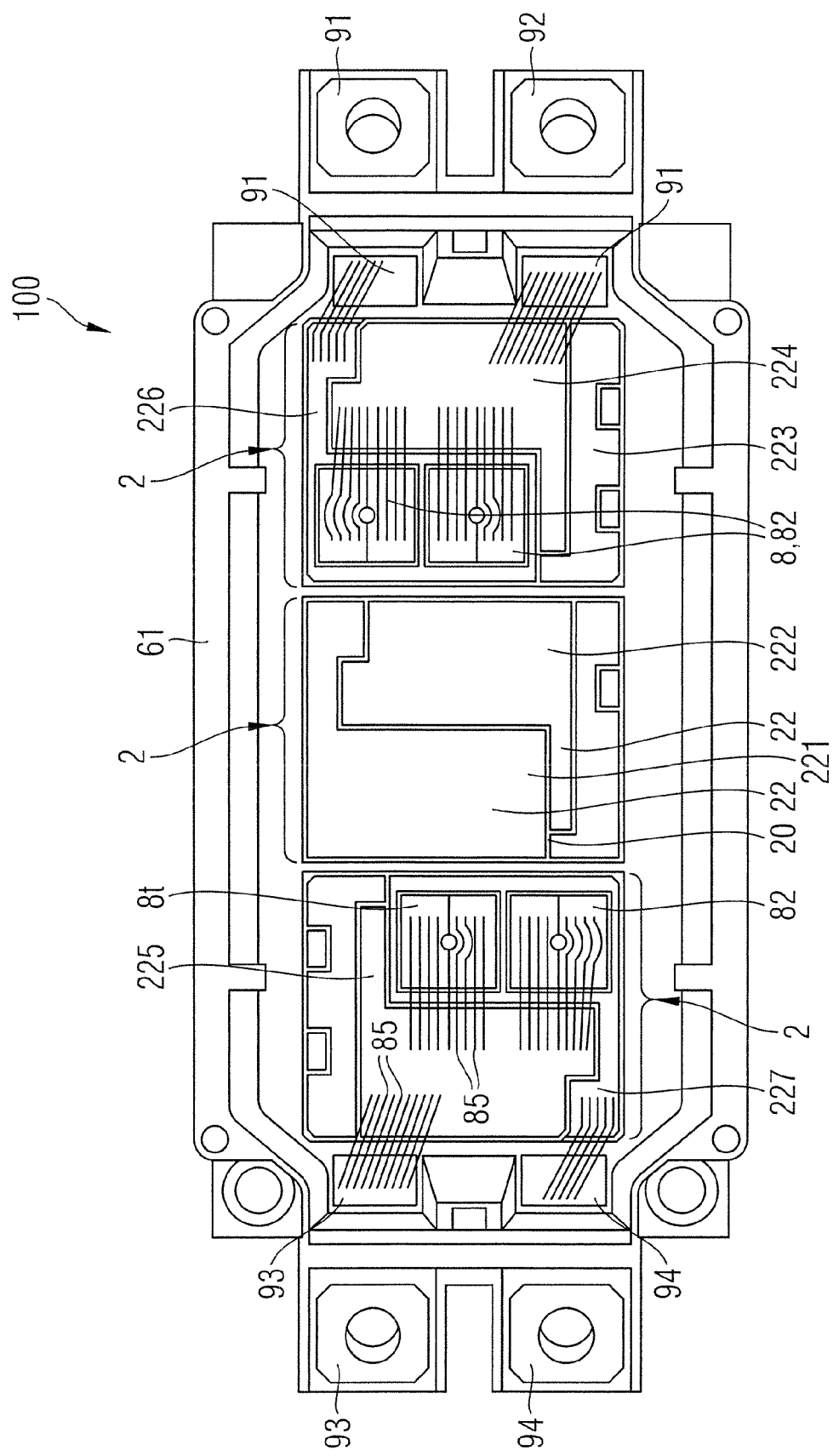
FIG. 5 shows a plan view of another power semiconductor module with the housing cover removed, prior to potting with a potting compound.

FIG. 5 shows a plan view of another embodiment of a power semiconductor module 100 prior to potting with a potting compound. The housing cover has not yet been placed onto the housing frame 61. The module 100 comprises, by way of example, three substrates 2, two of which are populated with power semiconductor chips 8. As can be discerned in this view, bonding wires 85 can be provided not only between power semiconductor chips 8 and conductor tracks 221, 222, 223, 224, 225, 226, 227 of the upper metallizations 22 of the substrates 2, but also between conductor tracks 226, 224, 225, 227 and portions of external connections 91, 92, 93 and 94, respectively, that are situated in the interior of the housing. After all module-internal connections have been produced, the module can be potted with a potting compound which has the same properties and can be composed of the same materials or material compositions as the potting compound 5 previously explained herein with reference to FIG. 1.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module, comprising:
a circuit carrier including an insulation carrier having a top side on which a metallization layer is arranged;
a power semiconductor chip arranged on a side of the metallization layer facing away from the insulation carrier, and which has, on a top side of the power semiconductor chip facing away from the circuit carrier, an upper chip metallization composed of copper or a copper alloy having a thickness of greater than or equal to 1 μm;
an electrical connection conductor composed of copper or a copper alloy connected to the upper chip metallization at a connecting location; and
a potting compound which extends from the circuit carrier to at least over the top side of the power semiconductor chip, completely covers the top side of the power semiconductor chip, and encloses the connection conductor at least in the region of the connecting location,
wherein the potting compound is a one-component potting material or a multi-component potting material;
wherein the one-component potting material is selected from the group consisting of: a silicone resin, and an epoxy resin;
wherein one of the components in the multi-component potting material is selected from the group consisting of: a silicone-gel, an internal adhesion promoter, a silicone resin, and an epoxy resin, and
wherein the compound ingredients of the multi-component potting material form a uniform potting compound that contacts the power semiconductor chip and the electrical connection conductor.

2. The power semiconductor module as claimed in claim 1, wherein the connection conductor is composed of pure copper, copper to the extent of at least 90% by weight, copper to the extent of at least 99% by weight, or copper to the extent of at least 99.9% by weight.

3. The power semiconductor module as claimed in claim 1, wherein the connection conductor is a bonding wire.

4. The power semiconductor module as claimed in claim 1, wherein the connection conductor is a ribbon or a metallic clip.

5. The power semiconductor module as claimed in claim 1, wherein the potting compound comprises a two-component phenyl silicone gel with internal adhesion promoter.

6. The power semiconductor module as claimed in claim 1, wherein the insulation carrier is a ceramic laminar.

7. The power semiconductor module as claimed in claim 1, wherein the connection conductor and any further connection conductor of the power semiconductor module which is at least partly covered by the potting compound are composed of pure copper, copper to the extent of at least 90% by weight, copper to the extent of at least 99% by weight, or copper to the extent of at least 99.9% by weight.

8. The power semiconductor module as claimed in claim 1, wherein the connection conductor, at the connecting location, is bonded or soldered or electrically conductively adhesively bonded to the top side of the power semiconductor chip.

9. The power semiconductor module as claimed in claim 1, wherein one or more connection conductors are provided, each of which, at a respective connecting location situated above the upper chip metallization, is electrically conductively bonded or soldered or electrically conductively adhesively bonded to the top side of the power semiconductor chip, and a sum of conductor cross sections of all of the connection conductors is at least 0.75 mm$^2$.

10. A method for operating a power semiconductor module, comprising:
providing a power semiconductor module comprising:
a circuit carrier including an insulation carrier having a top side on which a metallization layer is arranged;
a power semiconductor chip arranged on a side of the metallization layer facing away from the insulation carrier, and which has, on a top side of the power semiconductor chip facing away from the circuit carrier, an upper chip metallization composed of copper or a copper alloy having a thickness of greater than or equal to 1 µm;

an electrical connection conductor composed of copper or a copper alloy connected to the upper chip metallization at a connecting location; and a potting compound which extends from the circuit carrier to at least over the top side of the power semiconductor chip, completely covers the top side of the power semiconductor chip, and encloses the connection conductor at least in the region of the connecting location, operating the power semiconductor chip for a duration of at least 20 seconds at a junction temperature of not less than 150° C.;

wherein the potting compound is a one-component potting material or a multi-component potting material;

wherein the one-component potting material is selected from the group consisting of: a silicone resin, and an epoxy resin;

wherein one of the components in the multi-component potting material is selected from the group consisting of: a silicone-gel, an internal adhesion promoter, a silicone resin, and an epoxy resin, and wherein the compound ingredients of the multi-component potting material form a uniform potting compound that contacts the power semiconductor chip and the electrical connection conductor.

11. The method as claimed in claim 10, comprising operating the power semiconductor chip for a duration of at least 10 seconds at a junction temperature of not less than 160° C.

* * * * *